United States Patent [19]
Stadjuhar, Jr. et al.

[11] Patent Number: 6,012,210
[45] Date of Patent: Jan. 11, 2000

[54] LIGHT EMITTING DIODE JIG

[75] Inventors: Robert Charles Stadjuhar, Jr., Woodland Park; Allan Clarkson Greist, Colorado Springs, both of Colo.

[73] Assignee: Skyline

[21] Appl. No.: 09/092,523

[22] Filed: Jun. 5, 1998

[51] Int. Cl.[7] ...................................................... B25B 1/20
[52] U.S. Cl. ........................ 29/281.5; 269/100; 269/287; 269/285; 269/901; 269/903; 269/909; 269/43; 29/281.1
[58] Field of Search .................................. 211/14, 71.01, 211/74; 29/281.1, 281.5; 269/43, 287, 909, 900, 903, 95, 100, 901, 285

[56] References Cited

U.S. PATENT DOCUMENTS

| | | | |
|---|---|---|---|
| 1,307,482 | 6/1919 | Cheek | 211/74 |
| 3,682,323 | 8/1972 | Bergquist et al. | 211/74 |
| 4,288,065 | 9/1981 | Braverman | 269/287 |
| 5,452,810 | 9/1995 | Schwartz | 211/74 |

*Primary Examiner*—Robert C. Watson
*Attorney, Agent, or Firm*—Dale B Halling

[57] ABSTRACT

An LED jig for securing a plurality of individual light emitting diodes to a circuit board module. The LED jig comprises a disk shaped structure having a plurality of openings in which the light emitting diodes are positioned. Flanges on each end of the openings serve to secure the light emitting diodes therein. The LED jig also comprises structures which protect the light emitting diodes from possible damage, structures which serve to secure the LED jig to the circuit board module, structures which serve as guides for properly mounting the LED jig to the circuit board, and structures which serve to offset the LED jig from the circuit board module.

20 Claims, 1 Drawing Sheet

LIGHT EMITTING DIODE JIG

BACKGROUND OF THE INVENTION

1. Field of the Invention

The present invention relates to a jig, and more particularly to a jig for securely holding a plurality of light emitting diodes in position on a circuit board module.

2. Discussion of the Related Art

Traffic advisory variable and changeable message signs and systems, collectively referred to as dynamic message signs, are the signs that are typically utilized on highways to provide information to drivers. As the information changes, the signs are updated usually via over the air programming, to reflect the changed information. For example, a variable message sign at one point in time may indicate that heavy traffic conditions exist on a particular corridor because of an accident and at a later time that normal traffic conditions exist.

Typically, variable message signs comprise a plurality of circuit board modules which in turn comprise a multiplicity of light producing elements such as light emitting diodes. The number of circuit board modules and light producing elements usually depends on the size of the sign and the desired resolution, i.e., from what distance is the sign readable to the average driver. Generally, each character in a display is formed from a single circuit board. Each circuit board in turn is populated with a multiplicity of individual light emitting diodes. The light emitting diodes are usually arranged in clusters thereby forming pixels in the character.

Currently, the light emitting diodes are individually positioned and mounted to the circuit board. Accordingly, it is difficult to ensure that the light emitting diodes are aligned properly. In addition, even if aligned properly on mounting, they may become easily misaligned, damaged or destroyed through movement or contact with foreign objects.

Another problem associated with the current manufacturing technique is flux contamination when soldering the leads of the light emitting diodes to the circuit board. If the light emitting diodes are not sufficiently offset from the circuit board, various problems including flux contamination, may occur when soldering the multiplicity of light emitting diodes to the circuit board.

SUMMARY OF THE INVENTION

In accordance with one aspect, the present invention is directed to a jig for holding light producing elements. The jig comprises a structure having first and second opposing surfaces and a plurality of cavities in which the light producing elements are positioned. The jig also comprises securing means cooperatively associated with the plurality of cavities for holding the light producing elements securely in position within the plurality of cavities, stops extending from the second opposing surface for creating a space between the second opposing surface of the structure and a circuit board to which the jig is detachably mountable, and locking mechanisms extending from the second opposing surface of the structure for detachably mounting the jig to the circuit board.

In accordance with another aspect, the present invention is directed to a jig for holding light producing elements. The jig comprises a structure having first and second opposing surfaces and a plurality of cavities in which the light producing elements are positioned. The jig also comprises securing means cooperatively associated with the plurality of cavities for holding the light producing elements securely in position within the plurality of cavities, protective devices extending from the first opposing surface of the structure for protecting the light producing elements from potential damage, stops extending from the second opposing surface for creating a space between the second opposing surface of the structure and a circuit board to which the jig is detachably mountable, and locking mechanisms extending from the second opposing surface of the structure for detachably mounting the jig to the circuit board.

In accordance with another aspect, the present invention is directed to a jig for holding light producing elements. The jig comprises a structure having first and second opposing surfaces and a plurality of cavities in which the light producing elements are positioned and securing means. The securing means are cooperatively associated with the plurality of cavities for holding the light producing elements securely in position within the plurality of cavities.

The jig for holding light emitting diodes or other light producing elements of the present invention provides a means for avoiding the difficulties of assembling and/or replacing light emitting diodes in variable message signs as briefly described above.

The jig for holding light emitting diodes of the present invention comprises a rigid, single, unitary structure for easily securing, maintaining and protecting a plurality of individual light emitting diodes in variable message signs. The rigid, single, unitary structure includes tapered alignment pins for easy mating with the circuit board of a variable message sign and pins to protect the upper portion of the light emitting diodes from damage. The pins for protecting the upper portion of the light emitting diodes are positioned so as not to interfere with the light from the light emitting diodes. In addition, once the light emitting diodes are positioned in the orifices of the disk, they are constrained from movement and thus there is substantially no risk of them becoming misaligned.

The jig for holding light emitting diodes of the present invention also comprises a unique flange arrangement which securely holds the light emitting diodes in position in the orifices and which allows light emitting diodes of varying size to be securely positioned in the orifices. The orifices are substantially cylindrical in shape and comprise a set of three inwardly extending flanges on one end thereof and a set of three inwardly extending flanges on the other end thereof. Each set of flanges is offset from the other, thereby providing a hexagonal appearance to the orifices. This unique flange arrangement provides for light emitting diodes of different size to be securely held in position within the jig. In addition, a secure fit is maintained by the flanges even through thermal cycling which tends to cause differential size changes.

The jig for holding light emitting diodes of the present invention is a light weight and extremely durable device for securing, maintaining and protecting light emitting diodes in variable message signs. The jig is also relatively inexpensive to manufacture utilizing well known techniques.

DETAILED DESCRIPTION OF THE PREFERRED EMBODIMENTS

The present invention is directed to an LED jig for securing a plurality of individual light emitting diodes or other light producing elements to circuit board modules comprising traffic advisory variable and changeable message signs and systems, collectively referred to as dynamic message signs. Each circuit board module comprises a plurality of light emitting diode populated LED jigs forming a character in the display on the variable message sign and each LED jig comprising a plurality of light emitting diodes is a pixel forming the character. The LED jig is typically removably mountable to the circuit board module and functions not only to securely hold individual light emitting diodes in proper alignment, but also provides a means for easily and safely inserting and removing the light emitting diodes to and from the circuit board module. In addition, the LED jig serves to protect the light emitting diodes from damage.

Each LED jig comprises a disk having first and second opposing surfaces and a plurality of orifices extending therebetween. The light emitting diodes are positioned and secured in the plurality of orifices. Flanges on the first and second opposing surfaces and extending inwardly into each orifice serve to secure the light emitting diodes firmly in position even with differential expansion and contraction due to thermal cycling. Each LED jig comprises a number of protruding structures which extend from both the first and second opposing surfaces of the disk. The protruding structures which extend from the first opposing surface of the disk are essentially pins which serve to protect the upper portion of the light emitting diodes from possible damage. The protruding structures which extend from the second opposing surface of the disk are locking mechanisms. The locking mechanisms function to secure the LED jig to the circuit board module. Each LED jig also comprises a number of alignment pins which extend from the second opposing surface of the disk and function to properly align the LED jig for mating with the circuit board module. The alignment pins may also include stops. The stops ensure that each LED jig is positioned such that the second opposing surface is spaced from the circuit board module a predetermined distance. This predetermined distance allows for air flow for cooling the light emitting diodes. This predetermined distance also allows for easy cleaning of the flux utilized in the soldering of the leads of the light emitting diodes to the circuit board module, thereby preventing potential contamination and corrosion problems. Additional stops may be utilized for additional stability.

Figure 1:
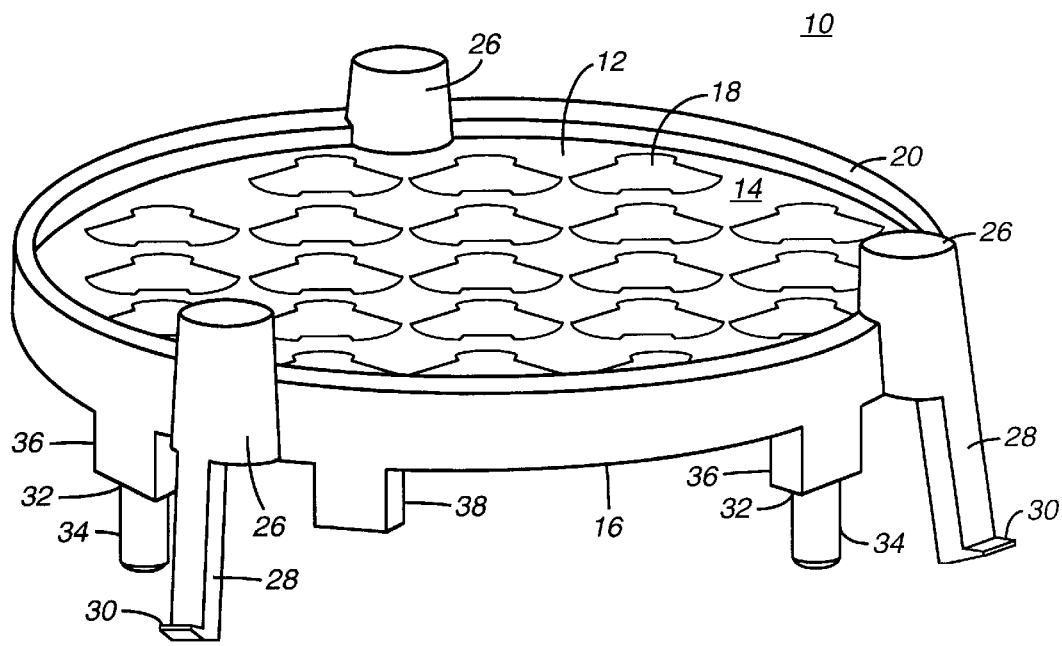
FIG. 1 is a diagrammatic representation of an exemplary LED jig in accordance with the present invention.

FIG. 1 is a diagrammatic representation of an exemplary embodiment of the LED jig 10 of the present invention. Light emitting diodes are not illustrated. As briefly discussed above, the LED jig 10 comprises a disk 12 having substantially flat first and second opposing surfaces 14, 16 and a plurality of orifices or LED cavities 18 extending therebetween in which the light emitting diodes are positioned. The disk 12 may comprise any suitable configuration. In the exemplary embodiment, the disk 12 comprises a substantially cylindrical configuration. The diameter of the disk 12 varies depending on the number of light emitting diodes which are to be positioned therein. The number of light emitting diodes included in each pixel depends upon the size of the variable message sign and the desired size and resolution of the image to be displayed thereon. Accordingly, the diameter of the disk 12 may vary depending on the number of light emitting diodes which are required for the pixel. In the illustrated exemplary embodiment, the disk 12 has a diameter of approximately one and one half (1.5) inches and includes twenty-one (21) LED cavities 18. In an alternate embodiment of the LED jig, the disk comprises a diameter of approximately one (1) inch and includes eight (8) LED cavities. Those skilled in the illumination art will readily recognize that the number of light emitting diodes may vary depending upon the application requirements, as briefly explained above, and thus the size of the disk 12 will generally also vary to accommodate the particular number of or density of light emitting diodes populating an LED jig 10. The disk 12 may have any suitable thickness which allows variously sized light emitting diodes to be securely held in position without obscuring the field of view of the light emitting portion of the light emitting diodes and allowing the leads of the light emitting diodes to be easily connected to the circuit board module utilizing conventional and non-conventional manufacturing techniques. Along the perimeter of both the first and second opposing surfaces 14, 16 of the disk 12 are raised ridges or lips 20. The raised ridges 20 add strength and rigidity to the disk 12.

The plurality of orifices or LED cavities 18 may be arranged in any suitable pattern on the disk 12. Typically, the arrangement or pattern of LED cavities 18 depends on the diameter of the disk 12 and the number of light emitting diodes to be placed therein. For example, in the exemplary embodiment illustrated in FIG. 1, the LED cavities 18 are arranged in linear rows. Specifically, in the exemplary embodiment, there are two rows of three LED cavities 18 and three rows of five LED cavities 18. In another embodiment, for example the one inch diameter disk, the LED cavities may be arranged in a circular pattern along the perimeter of the disk with an additional LED cavity in the center. In this embodiment, the disk comprises eight (8) LED cavities. Those skilled in the illumination art will readily recognize various suitable arrangements based upon the size of the disk and the number of light emitting diodes to be used for a single pixel.

Figure 2:
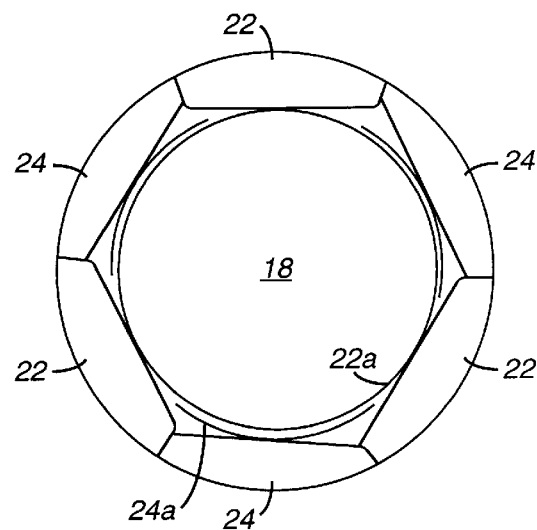
FIG. 2 is a detailed diagrammatic representation of a single LED cavity in accordance with the present invention.

The LED cavities 18 may comprise any suitable configuration. In the exemplary embodiment, the LED cavities are substantially cylindrical in configuration and sized to accommodate various size light emitting diodes. In order to securely hold light emitting diodes which may have different sizes and through the size and shape changes which may be caused by thermal cycling, the LED cavities comprise a number of flanges or tabs. FIG. 2 is a detailed diagram of a single LED cavity 18 as viewed from the first opposing surface 14 of the disk 12. As illustrated in FIG. 2, the LED cavity 18 comprises three flanges on each end thereof. The upper flanges 22 extend inwardly from the perimeter of the LED cavity 18 toward the center of the LED cavity 18 and are tangent to a circle 22a having a first diameter. The upper flanges 22 are essentially extensions of the first opposing surface 14 of the disk 12; however, alternate arrangements may be utilized. The upper flanges 22 may be arranged in any suitable pattern. In the exemplary embodiment, the upper flanges 22 are arranged such that two of the three are in one hemisphere and the remaining flange is in the other hemisphere. The lower flanges 24 also extend inwardly from the perimeter of the LED cavity towards the center of the LED cavity 18 and are tangent to a circle having a second diameter. As with the upper flanges 22, the lower flanges 24 are essentially extensions of the second opposing surface 16 of the disk 12. The lower flanges 24 may also be arranged in any suitable pattern. In the exemplary embodiment, the lower flanges 24 are arranged such that two of the three are in the same hemisphere as the single upper flange 22 and the remaining lower flange 24 is in the same hemisphere as the two upper flanges 22. Accordingly, as viewed from either the first or second opposing surface, the LED cavity 18 appears to have a hexagonal configuration. The upper and lower flanges 22, 24 may be tangent to circles having equal diameters; however, in the exemplary embodiment illustrated in FIG. 2, the circles 22a, 24a have different diameters. Since the up per flanges 22 are tangent to a circle having a first diameter 22a and the lower flanges 24 are tangent to a circle having a second diameter 24a which are different, the LED cavities 18 comprise two concentric structures. This arrangement provides for a secure friction fit for the light emitting diodes. In the exemplary embodiment, the second diameter is greater than the first diameter.

Those skilled in the art will readily recognize that other arrangements or modifications to the above described flange arrangement may be utilized to secure light emitting diodes in position in the LED jig 10.

As stated above, the LED jig 10 also comprises a number of protruding structures which extend from both the first and second opposing surfaces of the disk 12. The protruding structures which extend from the first opposing surface of the disk are pins which protect the light emitting diodes. Protection for the light emitting diodes may be required for a number of reasons. For example, when the plurality of light emitting diodes are to be mounted to or removed from the circuit board module as a complete pixel, one or more of the light emitting diodes may be damaged. Alternately, another object may fall onto the LED jig 10 and without protective pins, the light emitting diodes may be destroyed. The number of pins may vary. In the exemplary embodiment illustrated in FIG. 1, the LED jig 10 comprises three pins 26 positioned around the perimeter of the disk 12. The pins 26 extend substantially perpendicular to the first opposing surface 14 of the disk 12 a distance sufficient to protect the upper portion of the light emitting diodes. The pins 26 may be positioned on the disk 12 in any suitable arrangement such that they do not interfere with the light emanating from the light emitting diodes positioned in the LED jig 10 or light from neighboring LED jigs on the same circuit board module. The pins 26 may comprise any suitable configuration. In the exemplary embodiment, the pins 26 comprise a slightly tapered cylindrical configuration having a substantially flat top section. The diameter of the pins 26 are preferably large and strong enough to provide protection for the light emitting diodes from a variety of dangers as suggested above.

The protruding structures which extend from the second opposing surface 16 of the disk 12 are locking mechanisms. In the exemplary embodiment, the protruding structures which extend from both surfaces 14, 16 are formed as part of the same structure, accordingly, since there are three pins 26, there are also three locking mechanisms 28, two of which are illustrated in FIG. 1; however, additional or fewer locking mechanisms 28 may be utilized. The locking mechanisms 28 function to secure the LED jig 10 to the circuit board module. The locking mechanism 28 may comprise any suitable structure for removably securing the LED jig 10 to the circuit board module. In the exemplary embodiment, the locking mechanism 28 comprises a semi-circular structure, which is a continuation of the pin 26, having a tapered flange 30 extending outwardly therefrom at a lower end thereof. The locking mechanisms 28 extend substantially perpendicularly from the second opposing surface 16 of the disk 12. The locking mechanisms 28 are angled slightly away from the disk 12 and are designed to bend or give slightly from where they join the disk 12. With this design, the locking mechanisms 28 may be bent perpendicular to the disk 12 by applying pressure thereto and positioned in corresponding openings in the circuit board module. Once the locking mechanism 28 is positioned within the corresponding opening in the circuit board module and the pressure on the locking mechanism 28 released, the locking mechanism 28 returns to its normal position and the tapered flange 30 engages the underside of the circuit board module to prevent the LED jig 10 from being disengaged from the circuit board module. To remove the LED jig 10, inwardly directed pressure may be applied to the locking mechanism 28 until the tapered flanges 30 are disengaged from the underside of the circuit board module. In other words, the same process as used for mounting is repeated for removal.

Although the pins 26 and the locking mechanisms 28 in the exemplary embodiment are formed from the same structure, the present invention is not limited thereto. For example, the pins 26 and locking mechanism 28 may comprise separate structures. Additionally, the number of pins 26 and locking mechanisms 28 may be different.

The LED jig 10 also comprises a number of alignment pins which extend from the second opposing surface 16 of the disk 12 and serve to properly align the LED jig 10 when mating the LED jig 10 to the circuit board module. The number of alignment pins may vary. In the exemplary embodiment, the LED jig 10 comprises three alignment pins 32, two of which are illustrated in FIG. 1, arranged around the perimeter of the disk 12. The alignment pins 32 may be positioned in any suitable location on the disk 12 such that they do not interfere with the connection of the leads of the light emitting diodes to the circuit board module. The alignment pins 32 fit through openings in the circuit board module. The alignment pins 32 may be of any suitable length. In the exemplary embodiment, the alignment pins 32 are slightly longer than the locking mechanisms 28.

The alignment pins 32 may comprise any suitable configuration. In the exemplary embodiment, the alignment pins 32 comprise guide portions 34 which are tapered cylindrical structures which fit into corresponding openings in the circuit board module and stop portions 36 which are substantially rectangular in shape and function to provide an offset between the second opposing surface 16 of the disk 12 and the circuit board module. The guide portions 34 are tapered for easy entry into the openings in the circuit board module. Alignment pins 32 are preferably utilized to ensure that the LED jigs 10 are properly aligned when mounted to the circuit board module. The stop portions 36 ensure that the second opposing surface 16 of the disk 12 is spaced from the circuit board module a sufficient distance which allows for an air flow for cooling the light emitting diodes, thereby preventing damage thereto. This predetermined distance also allows for easy cleaning of the flux utilized in the soldering of the leads of the light emitting diodes to the circuit board module, thereby preventing potential contamination and corrosion problems. Typically, a wave soldering technique is utilized to solder the leads to the circuit board module.

Although the alignment pins 32 comprise both a guide portion 34 and a stop portion 36, in an alternate embodiment, the LED jig 10 may comprise separate guides and stops. In the exemplary embodiment illustrated in FIG. 1, the LED jig 10 comprises additional separate stops 38, i.e. stops without guide portions. The LED jig 10 may comprise any number of additional stops 38 which may be of any suitable configuration. In the exemplary embodiment, the LED jig 10 comprises three additional stops 38, only one of which is illustrated in FIG. 1, having a substantially rectangular configuration. The additional stops 38 may be positioned in any suitable position on the disk 12 and are preferably positioned on one side of the locking mechanism 28 while the guides 34/stops 36 are positioned on the other side of the locking mechanism 28. This arrangement provides for a more stable structure.

The LED jig 10 of the present invention may comprise any suitable configuration. In the exemplary embodiment, the LED jig 10 is formed as a one piece or single, unitary structure. A one piece unitary structure is generally more reliable than a structure of this nature formed from multiple components. The one piece unitary structure may be manufactured in any number of ways. For example, the LED jig 10 may be machined from a single piece of material. However, in the preferred embodiment, the LED jig 10 is manufactured utilizing a molding process, and preferably an injection molding process.

The LED jig 10 may be formed from any suitably rigid material which is preferably non-corrosive and which is able to withstand substantially all weather conditions and environmental extremes. Alternately, the LED jig 10 may be formed from one material and coated with a protective material able to withstand various weather conditions and environmental extremes. The LED jig 10 is preferably formed from a material capable of withstanding temperature ranges from about −40 degrees C to about 70 degrees C. In addition, the LED jig 10 is preferably formed from a material or coated with a material having a color and finish that provides for a maximum contrast for the light emitting diodes. This type of color/finish combination ensures that the variable message signs are easy to read. The LED jig 10 is also preferably formed from a non-corrosive, non-conducting material such as an elastomeric or polymeric material. In a preferred embodiment, the LED jig 10 is formed from a black nylon with a dull finish.

Although shown and described is what is believed to be the most practical and preferred embodiments, it is apparent that departures from specific designs and methods described and shown will suggest themselves to those skilled in the art and may be used without departing from the spirit and scope of the invention. The present invention is not restricted to the particular constructions described and illustrated, but should be construed to cohere with all modifications that may fall within the scope of the appended claims.

What is claimed is:

1. A jig for holding light producing elements comprising:
   a structure having first and second opposing surfaces and a plurality of cavities in which the light producing elements are positioned;
   securing means cooperatively associated with the plurality of cavities for holding the light producing elements securely in position within the plurality of cavities;
   stops extending from the second opposing surface of the structure for creating a space between the second opposing surface of the structure and a circuit board to which the jig is detachably mountable; and
   locking mechanisms extending from the second opposing surface of the structure for detachably mounting the jig to the circuit board.

2. The jig for holding light producing elements according to claim 1, wherein the light producing elements are light emitting diodes.

3. The jig for holding light producing elements according to claim 1, wherein the structure comprises a substantially cylindrical disk.

4. The jig for holding light producing elements according to claim 3, wherein the plurality of cavities are arranged in a predetermined pattern on the disk and comprise substantially cylindrical structures.

5. The jig for holding light producing elements according to claim 4, wherein the securing means comprises a first and second set of flanges for each of the plurality of cavities.

6. The jig for holding light producing elements according to claim 5, wherein each of the first set of flanges extend inwardly from the first opposing surface of the disk towards the center of its associated cavity and each of the second set of flanges extend inwardly from the second opposing surface of the disk towards the center of its associated cavity.

7. The jig for holding light producing elements according to claim 6, wherein the locking mechanisms comprise semi-circular structures having tapered flanges extending outwardly from a distal end thereof, the tapered flanges engaging the circuit board.

8. The jig for holding light producing elements according to claim 1, further comprising alignment pins extending from the second opposing surface of the structure for positioning the jig in a predetermined location on the circuit board.

9. The jig for holding light producing elements according to claim 8, wherein the structure having first and second opposing surfaces, securing means, stops, locking mechanisms and alignment pins are formed as single, unitary structure.

10. A jig for holding light producing elements comprising:
    a structure having first and second opposing surfaces and a plurality of cavities in which the light producing elements are positioned;
    securing means cooperatively associated with the plurality of cavities for holding the light producing elements securely in position within the plurality of cavities;
    protective devices extending from the first opposing surface of the structure for protecting the light producing elements from potential damage;
    stops extending from the second opposing surface of the structure for creating a space between the second opposing surface of the structure and a circuit board to which the jig is detachably mountable; and
    locking mechanisms extending from the second opposing surface of the structure for detachably mounting the jig to the circuit board.

11. The jig for holding light producing elements according to claim 10, wherein the light producing elements are light emitting diodes.

12. The jig for holding light producing elements according to claim 10, wherein the structure comprises a substantially cylindrical disk.

13. The jig for holding light producing elements according to claim 12, wherein the plurality of cavities are arranged in a predetermined pattern on the disk and comprise substantially cylindrical structures.

14. The jig for holding light producing elements according to claim 13, wherein the securing means comprises a first and second set of flanges for each of the plurality of cavities.

15. The jig for holding light producing elements according to claim 14, wherein each of the first set of flanges extend inwardly from the first opposing surface of the disk towards the center of its associated cavity and each of the second set of flanges extend inwardly from the second opposing surface of the disk towards the center of its associated cavity.

16. The jig for holding light producing elements according to claim 15, wherein the protective devices comprise pins arranged around the periphery of the disk.

17. The jig for holding light producing elements according to claim 16, wherein the locking mechanisms comprise semi-circular structures having tapered flanges extending outwardly from a distal end thereof, the tapered flanges engaging the circuit board.

18. The jig for holding light producing elements according to claim 10, further comprising alignment pins extending from the second opposing surface of the structure for positioning the jig in a predetermined location on the circuit board.

19. The jig for holding light producing elements according to claim 17, wherein the structure having first and second opposing surfaces, securing means, protective devices, stops, locking mechanisms and alignment pins are formed as single, unitary structure.

20. A jig for holding light producing elements comprising:
a structure having first and second opposing surfaces and a plurality of cavities in which the light producing elements are positioned;
securing means cooperatively associated with the plurality of cavities for holding the light producing elements securely in position within the plurality of cavities; and
protective devices extending from the first opposing surface of the structure for protecting the light producing elements from potential damage.

\* \* \* \* \*